(12) United States Patent
Yuki

(10) Patent No.: US 6,611,156 B2
(45) Date of Patent: Aug. 26, 2003

(54) WAVEFORM DATA GENERATION APPARATUS

(75) Inventor: Eiichiro Yuki, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/224,390

(22) Filed: Aug. 21, 2002

(65) Prior Publication Data

US 2003/0038657 A1 Feb. 27, 2003

(30) Foreign Application Priority Data

Aug. 21, 2001 (JP) ..................................... P2001-249856
Aug. 1, 2002 (JP) ..................................... P2002-224964

(51) Int. Cl.$^7$ ................................................. G06F 7/38
(52) U.S. Cl. ......................... 327/105; 327/106; 708/276
(58) Field of Search ................................ 327/105, 106, 327/107; 708/276, 440

(56) References Cited

U.S. PATENT DOCUMENTS 4,827,442 A  *  5/1989  Mehrgardt et al. .......... 708/276
6,009,449 A  * 12/1999  Takahashi ................... 708/440
6,333,649 B1 * 12/2001  Dick et al. .................. 327/105

* cited by examiner

Primary Examiner—Dinh T. Le
(74) Attorney, Agent, or Firm—Rader, Fishman & Grauer PLLC; Ronald P. Kananen

(57) ABSTRACT

A first waveform data storage portion stores sine wave data or cosine wave data in either of the angular sections on both sides of a zero-crossing point of a sine wave or a cosine wave, each of the angular sections being defined by 45 degrees of an angular which is defined as one of eight sections equally divided by an angle range 0–360 degrees on the basis of 0 degrees. A second waveform data storage portion stores sine wave data or cosine wave data in an angular section adjacent to the angular section in which the data stored in the first waveform data storage portion exist. An angular data generation portion outputs address data that are a counted value of pulses at every angular section of 45 degrees, and three-bit data are carried-up at every generation of the address data. The address data are used for reading waveform data from the first and the second waveform data storage portions. The three-bit data are applied to an address data selection portion, a waveform data selection portion, and a polarity processing portion as an address selection signal, a waveform data selection signal and a polarity processing signal to be used for the signal adjustment in response to the angular sections.

4 Claims, 17 Drawing Sheets

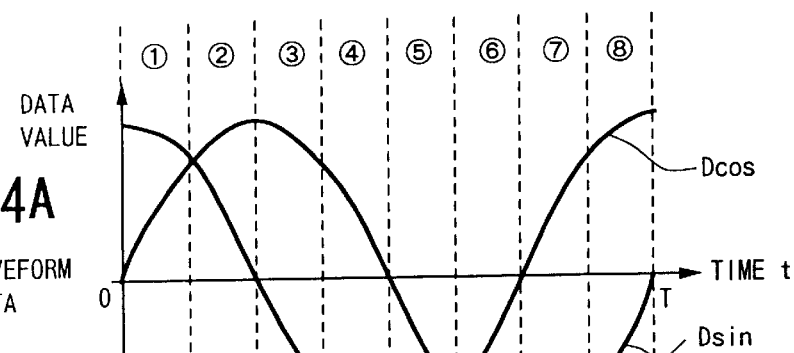
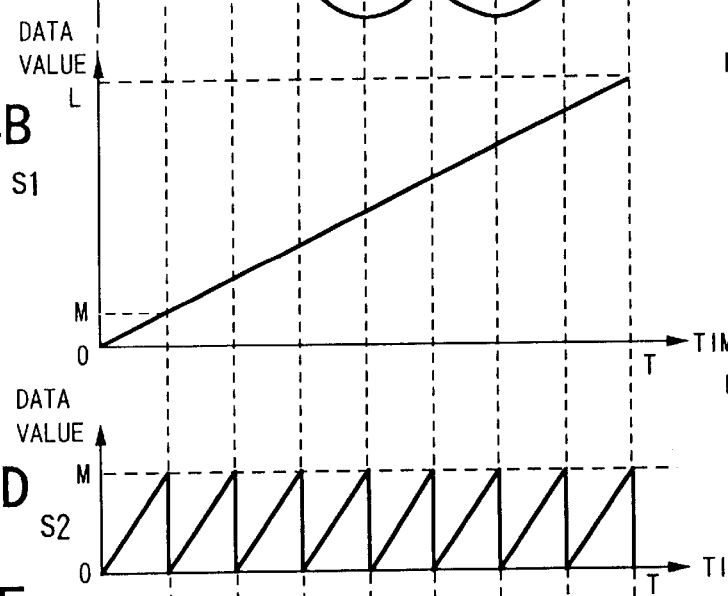
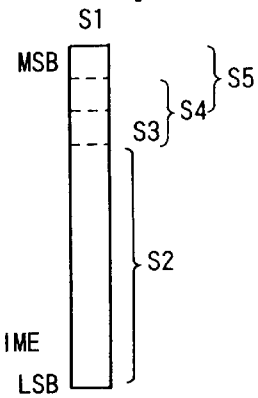

FIG.5

| ANGULAR SECTIONS | ① | ② | ③ | ④ | ⑤ | ⑥ | ⑦ | ⑧ |
|---|---|---|---|---|---|---|---|---|
| S3 | 0 | 1 | 0 | 1 | 0 | 1 | 0 | 1 |
| <1> | FORWARD | BACKWARD | FORWARD | BACKWARD | FORWARD | BACKWARD | FORWARD | BACKWARD |
| <2> | BACKWARD | FORWARD | BACKWARD | FORWARD | BACKWARD | FORWARD | BACKWARD | FORWARD |

FIG.6

| ANGULAR SECTIONS | ① | ② | ③ | ④ | ⑤ | ⑥ | ⑦ | ⑧ |
|---|---|---|---|---|---|---|---|---|
| S4 | 00 | 01 | 10 | 11 | 00 | 01 | 10 | 11 |
| S10 | <1> | <2> | <2> | <1> | <1> | <2> | <2> | <1> |
| S11 | <2> | <1> | <1> | <2> | <2> | <1> | <1> | <2> |

FIG.7

| ANGULAR SECTIONS | ① | ② | ③ | ④ | ⑤ | ⑥ | ⑦ | ⑧ |
|---|---|---|---|---|---|---|---|---|
| S5 | 00 | 00 | 01 | 01 | 10 | 10 | 11 | 11 |
| Dsin | + | + | + | + | − | − | − | − |
| Dcos | + | + | − | − | − | − | + | + |

| ANGULAR SECTIONS | ① | ② | ③ | ④ | ⑤ | ⑥ | ⑦ | ⑧ |
|---|---|---|---|---|---|---|---|---|
| S4 | 00 | 01 | 10 | 11 | 00 | 01 | 10 | 11 |
| S10 | <2> | <1> | <1> | <2> | <2> | <1> | <1> | <2> |
| S11 | <1> | <2> | <2> | <1> | <1> | <2> | <2> | <1> |

| ANGULAR SECTIONS | ① | ② | ③ | ④ | ⑤ | ⑥ | ⑦ | ⑧ |
|---|---|---|---|---|---|---|---|---|
| S3 | 0 | 1 | 0 | 1 | 0 | 1 | 0 | 1 |
| <1> | FORWARD | BACKWARD | FORWARD | BACKWARD | FORWARD | BACKWARD | FORWARD | BACKWARD |
| <2> | FORWARD | BACKWARD | FORWARD | BACKWARD | FORWARD | BACKWARD | FORWARD | BACKWARD |

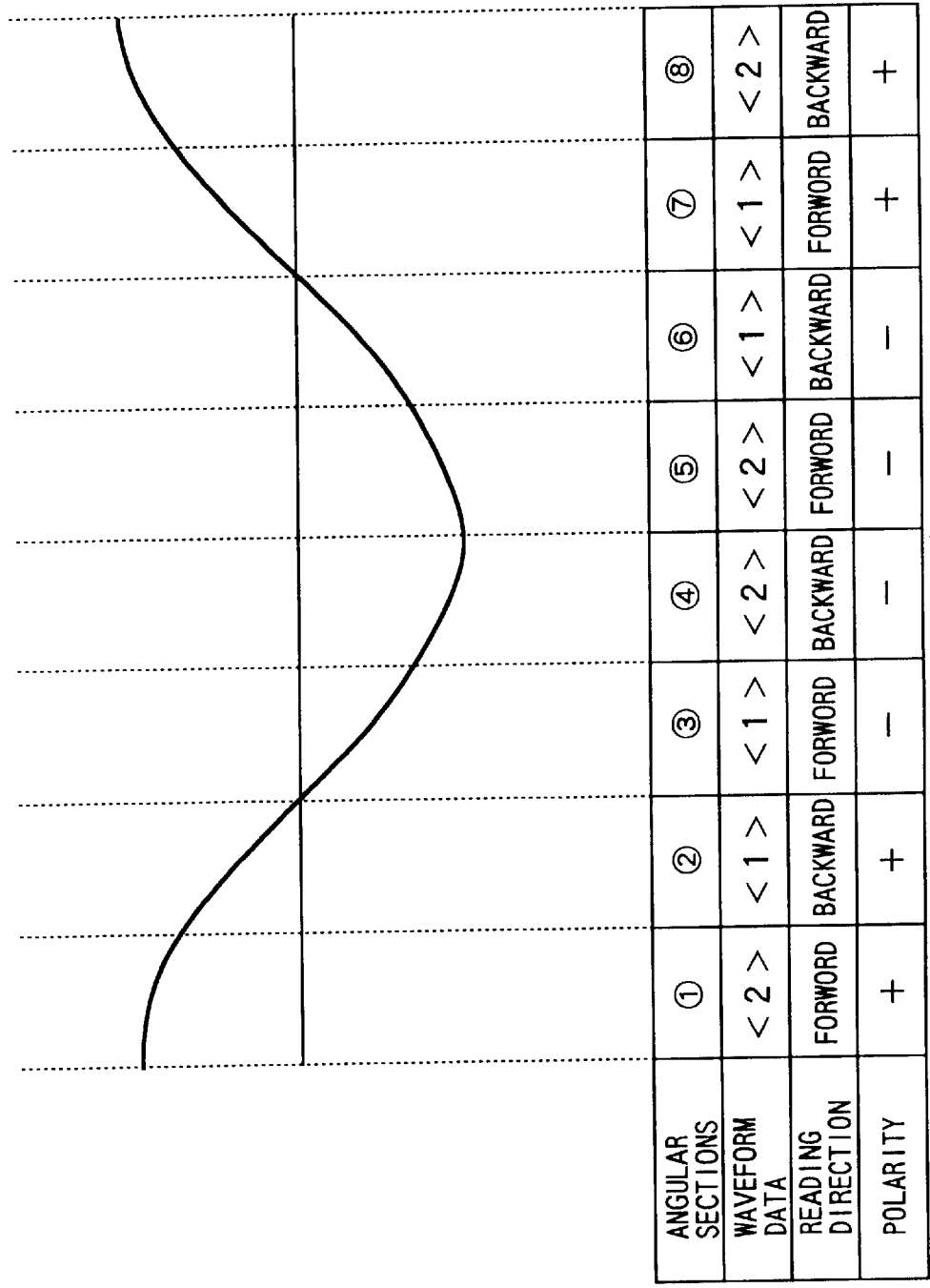

ance within a range 0–360 degrees having a first
WAVEFORM DATA GENERATION APPARATUS

BACKGROUND OF THE INVENTION

1. Field of the Invention

The present invention generally relates to a waveform data generation apparatus for simultaneously generating sine wave data and cosine wave data.

2. Description of the Related Art

A waveform data generation apparatus is used in an apparatus for performing modulation and demodulation by the use of a quadrature component. The apparatus for performing modulation and demodulation is, for example, a communication apparatus using a digital modulation demodulation system such as quadrature phase shift keying (QPSK) or the like, a color encoder for performing the digital quadrature modulation of two color-difference signals to output a modulated color-difference signal, or the like. The waveform data generation apparatus simultaneously generates a sine wave signal $\sin\omega t$ and a cosine wave signal $\cos\omega t$, where the angle changes in response to time.

As the simplest system of such a waveform data generation apparatus, there is known a system which is equipped with read only memories (ROM's), in which a period of waveform data for a sine waveform and a period of waveform data for a cosine waveform are separately stored, and from which the stored sine waveform data and cosine waveform data simultaneously are read by the use addresses defined by time variables.

Although the system reading data from the ROM's has an advantage that a circuit configuration of the system is simple, the system encounters the disadvantage that the system needs two ROM's having a large storage capacity, and the system encounters the disadvantage that it becomes difficult to configure a waveform data generation apparatus as a single integrated circuit, and the like.

For remedying the aforesaid disadvantage, for example, as disclosed in Japanese Patent Publication (kokai) No. 8-256352, there is known a method for further decreasing waveform data to be stored in the ROM's, which utilizes the periodicity of the angles of a sine waveform and a cosine waveform to store only the waveform data of a half or a quarter of the angle of one period in the ROM's, and generates sine waveform data and cosine waveform data for a period from the waveform data read from the ROM's by the use of the periodicity of the angles.

Although the method disclosed in Japanese Patent Publication (Kokai) No. 8-256352 has the advantage that it can decrease the storage capacities of the ROM's to a half or a quarter of those of previous ROM's, the method encounters the disadvantage that the configuration of a control circuit for generating addresses for reading waveform data from the ROM's in consideration of the periodicity of angles becomes complicated. That is, the method needs arithmetic operation processing such as addition, subtraction and the like for generating address data, and the method needs condition branching processing for switching the generation method of address data according to angles. Consequently, the configuration of the control circuit becomes complicated.

SUMMARY OF THE INVENTION

An object of the present invention is to provide a waveform data generation apparatus capable of decreasing the number of waveform data to be stored in a storage portion and capable of simplifying the configuration thereof.

According to a first aspect of the present invention, there is provided a waveform data generation apparatus for generating sine wave data and cosine wave data according to an angle change within a range 0–360 degrees having a first storage portion for storing first sine wave data or a first cosine wave data in either of the angular sections on both sides of a zero-crossing point of a sine wave or a cosine wave, each of the angular sections being 45 degrees of an angular range which is defined as one of eight sections equally divided between 0 and 360 degrees on the basis of 0 degree; a second storage portion for storing second sine wave data or second cosine wave data in an angular section adjacent to the angular section on which the data stored in the first storage portion exists, under a condition that the first sine wave data or the first cosine wave data and the second sine wave data or the second cosine wave data include 0 and a maximum or a minimum thereof; a pulse counting portion for counting pulses indicating an angular change and outputting the binary counted value corresponding to an angle within a range 0–360 degrees, the pulse counting portion outputting a first counted value to be reset at every angular section, and a second counted value being a counted value of a bit carried-up at every reset of the first counted value at every 45 degrees; a read address selection portion including an angle inversion portion for performing an angle inversion of the first counted value on the basis of 45 degrees, and first selection portion for receiving a first inverted counted value, which is angle-inverted by the angle inversion portion, and the first counted value and outputting the received two counted values as a reading address of the first and the second storage portions according to the least significant bit of the second counted value; a data selection portion including a second selection portion for receiving the sine wave data and the cosine wave data, which are read out from the first and the second storage portions in response to the address output from the read address selection portion, and selecting and outputting the sine wave data and the cosine wave data according to the states of two bits of the least significant bit of the second counted value and a higher order bit adjacent to the least significant bit; and a polarity processing portion including a first polarity conversion portion for converting a polarity of the sine wave data output from the second selection portion, a second polarity conversion portion for converting a polarity of the cosine wave data output from the second selection portion, and a third selection portion for receiving the sine wave data output from the second selection portion, the sine wave data having a polarity converted by the first polarity conversion portion, the cosine wave data output from the second selection portion, and the cosine wave data having a polarity converted by the second polarity conversion portion, and selecting and outputting the sine wave data and the cosine wave data, the polarities of both being processed according to the states of two bits of one and two higher order bits next to the least significant bit.

BRIEF DESCRIPTION OF THE DRAWINGS

The above and other objects, features and advantages of the present invention will become more apparent from the following description with reference to the accompanying drawings, in which:

FIGS. 4A to 4H are diagrams illustrating examples of waveform data Dsinωt (or θ) and Dcosωt (or θ) in eight angular sections illustrated in FIG. 2, an angular signal indicating an angle change with in a range 0–360 degrees, a data format of the angular signal, address data for reading the waveform data from a first and a second waveform data storage portion, an address selection signal, a waveform data selection signal, and a polarity processing signal;

FIG. 5 is a diagram showing the reading direction of waveform data from the first and the second waveform data storage portions illustrated in FIG. 1 at every angular section illustrated in FIG. 2;

FIG. 6 is a diagram showing the waveform data storage portions serving as sources of the waveform data output from the waveform data selection portion illustrated in FIG. 1 at every angular section illustrated in FIG. 2;

FIG. 7 is a diagram showing the polarities of the sine wave data Dsin and the cosine wave data Dcos that are adjusted at a polarity processing portion illustrated in FIG. 1 at every angular section illustrated in FIG. 2;

FIG. 20 is a diagram illustrating the reading direction and the polarities of the waveform data of a cosine wave read from the waveform data storage portion in the waveform data generation apparatus of the fifth embodiment of the present invention in response to the read address.

DESCRIPTION OF THE PREFERRED EMBODIMENTS

First Embodiment

A first embodiment of a waveform data generation apparatus of the present invention will be described with reference to FIG. 1 to FIG. 9.

Figure 1A:
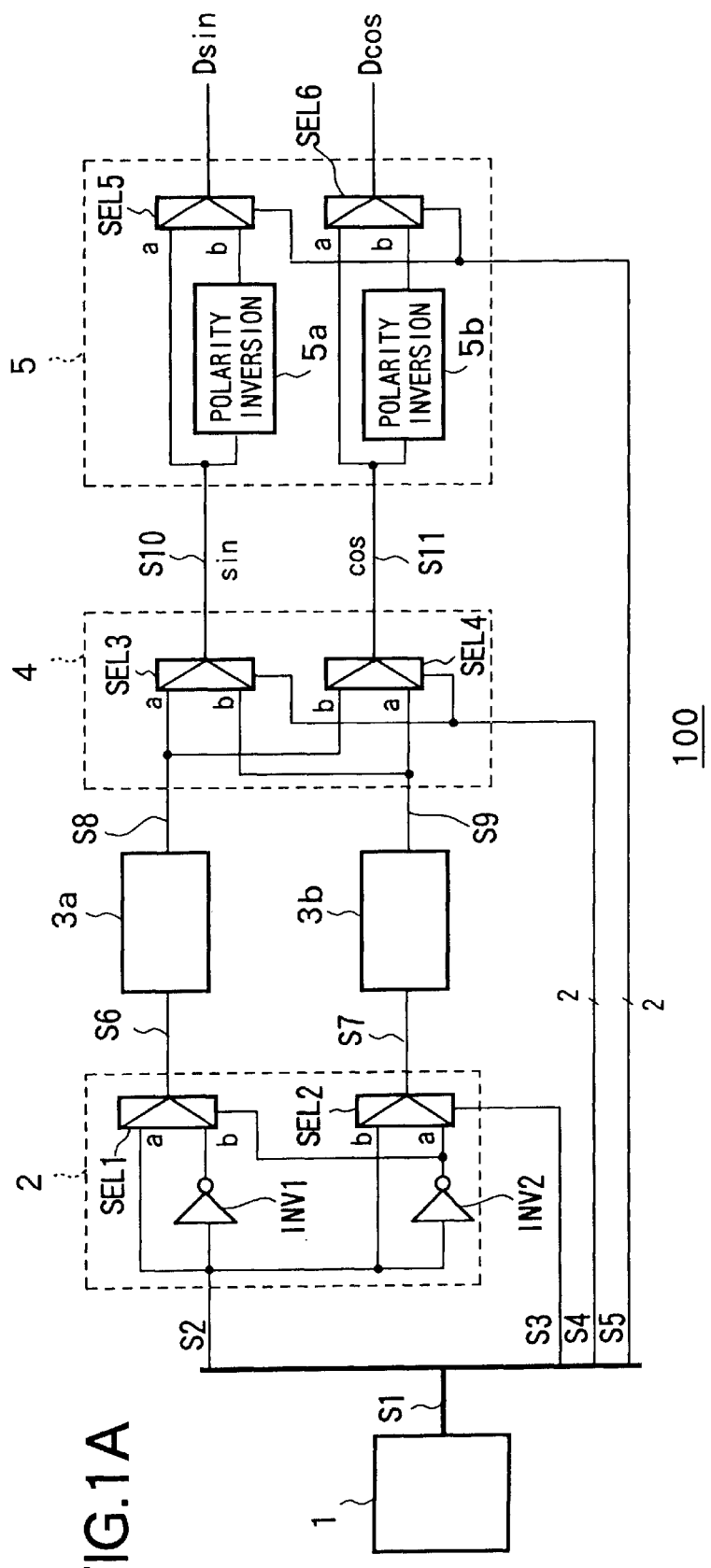
FIG. 1A is a block diagram showing a configuration example of a waveform data generation apparatus according to a first embodiment of the present invention.
Figure 1B:
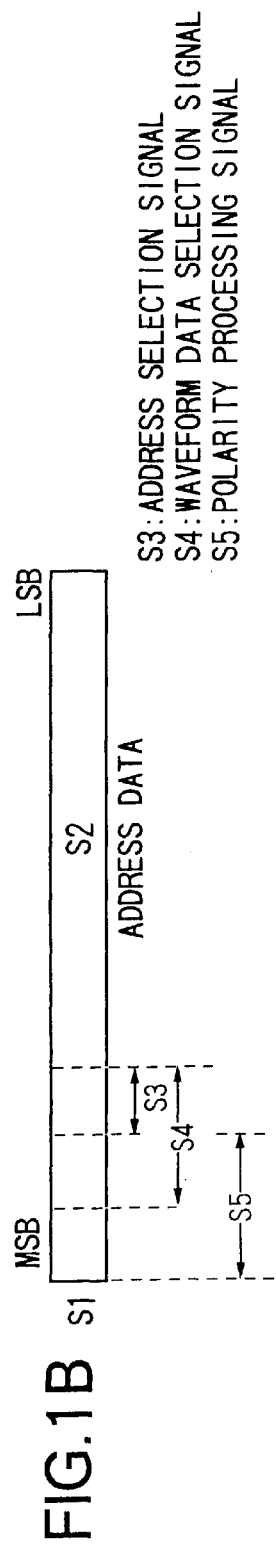
FIG. 1B is a diagram illustrating a data format of an angular signal including address data and control signals.

FIG. 1 is a block diagram showing a configuration example of a waveform data generation apparatus 100 according to the first embodiment of the present invention.

The waveform data generation apparatus 100 includes an angular data generation portion 1, an address data selection portion 2, a first and a second waveform data storage portions 3a and 3b, a waveform data selection portion 4 and a polarity processing portion 5.

Angular Sections

Figure 2:
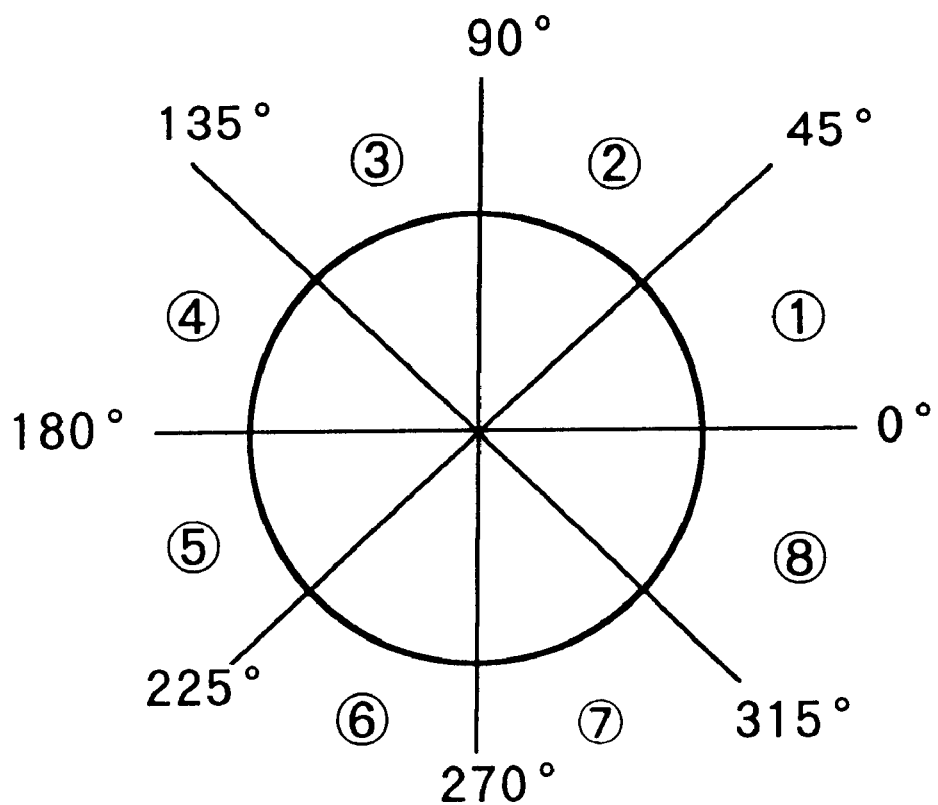
FIG. 2 is a diagram illustrating eight angular sections defined by one of eight sections equally divided by a period of angles of sine wave data and cosine wave data generated by an embodiment of a waveform data generation apparatus of the present invention.

FIG. 2 is a diagram illustrating eight angular sections defined by eight sections equally divided by a period of angles, 360°, on the basis of 0 degrees of a sine wave data Dsinθ (or ωt) and a cosine wave data Dcosθ (or ωt) generated by the waveform data generation apparatus of the embodiment of the present invention. Angular sections ①–⑧ respectively indicate 0°–45°, 45°–90°, 90°–135°, 135°–180°, 180°–225°, 225°–270°, 270°–315°, and 315°–360°.

Storage Data in First and Second Waveform Data Storage Portions

Figure 3:
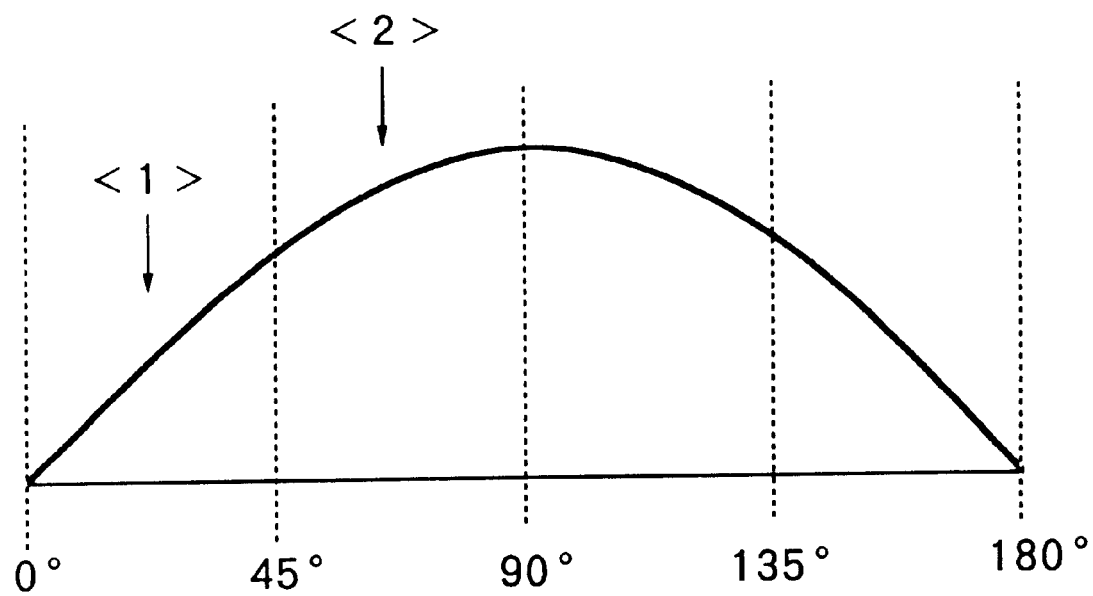
FIG. 3 is a diagram illustrating waveform data to be stored in waveform data storage portions of the waveform data generation apparatus illustrated in FIG. 1.

FIG. 3 is a diagram illustrating waveform data to be stored in the first and the second waveform data storage portions 3a and 3b, as a first example. Reference numeral <1> designates waveform data of a sine wave in the angular section ①, 0°–45°, to be stored in the waveform data storage portion 3a. Reference mark <2> designates waveform data of the sine wave in the angular section ②, 45°–90°, to be stored in the waveform data storage portion 3b. In such a way, only the waveform data for 45 degrees are stored in the first and the second waveform storage portions 3a and 3b, severally.

Figures 10, 11:
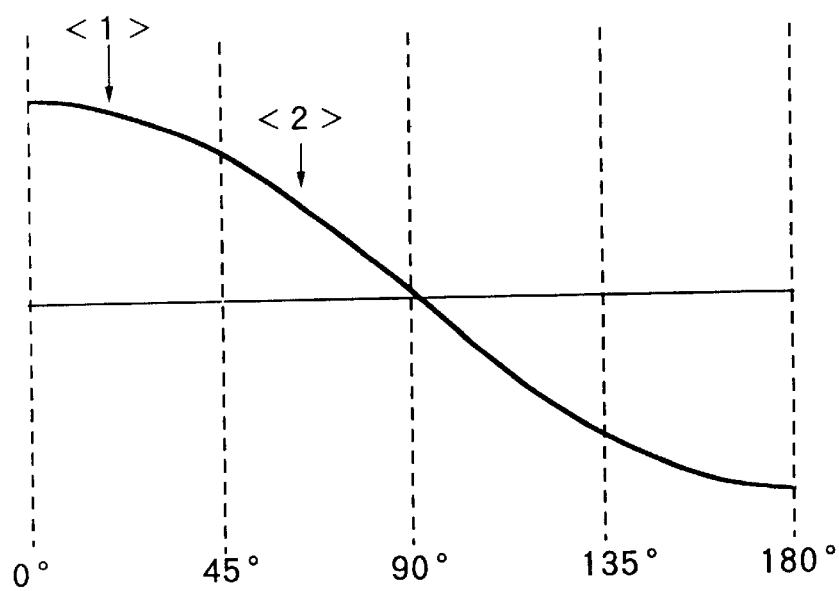
FIG. 10 is a diagram illustrating the case where the waveform data of a cosine wave within a range 0–45 degrees are stored in the first waveform data storage portion and the waveform data of the cosine wave within a range 45–90 degrees are stored in the second waveform data storage portion as an example of a second embodiment of the present invention.
FIG. 11 is a diagram showing the waveform data storage portions serving as sources of the waveform data output from the waveform data selection portion in the waveform data generation apparatus of the second embodiment of the present invention at every angular section illustrated in FIG. 2.
Figures 17, 18:
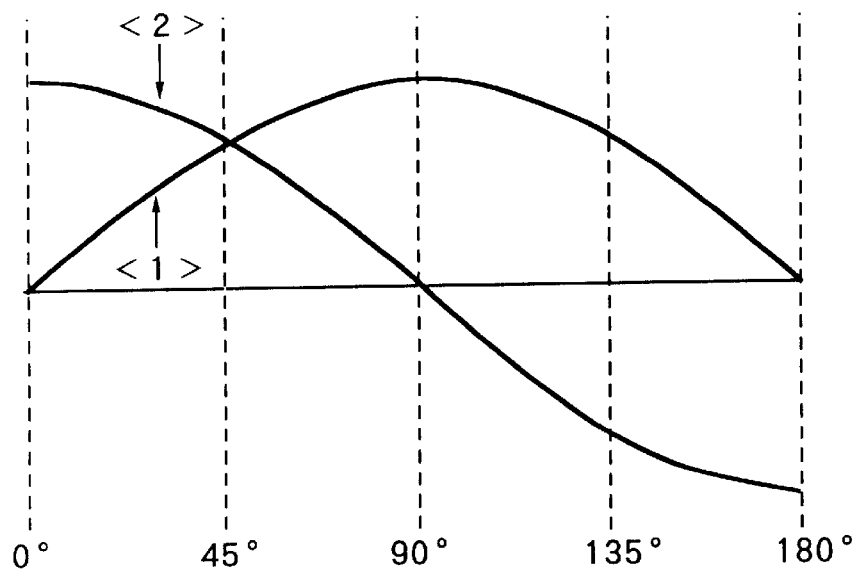
FIG. 17 is a diagram illustrating the reading and the polarities of the waveform data read from the waveform data storage means in the waveform data generation apparatus of the fifth embodiment of the present invention.
FIG. 18 is a diagram showing the reading direction of waveform data from the first and the second waveform data storage portions of the waveform data generation apparatus of the fifth embodiment of the present invention at every angular section illustrated in FIG. 2.

The waveform data stored in the first and the second waveform data storage portions 3a and 3b are, as exemplified also in FIGS. 10 and 17 besides FIG. 3, (1) a sine wave data or a cosine wave data in either of angular sections on both sides of a zero-crossing point of a sine wave or a cosine wave, each of the angular sections being defined as 45 degrees of an angular which is defined as one of eight sections equally divided by an angle range 0–360 degrees on the basis of 0 degree, and (2) sine wave data or cosine wave data in an angular section adjacent to the angular section in which the aforesaid data exist. When the two data are synthesized, the synthesized data substantially express sine wave data or cosine wave data in a range 0–90 degrees.

Angular Data Generation Portion, Angular Signal

FIGS. 4A to 4H are diagrams illustrating examples of waveform data Dsinωt (or θ) and Dcosωt (or θ) in eight angular sections illustrated in FIG. 2, an angular signal indicating an angle change with in a range 0–360 degrees, a data format of the angular signal, an address data S2 for reading the waveform data from the first and the second waveform data storage portions 3a and 3b, and each of the control signals S3, S4 and S5.

The angular data generation portion 1 is composed of, for example, a single counter. As illustrated in FIG. 4B, the angular data generation portion 1 counts pulses indicating angular changes in a range 0–360 degrees to output a binary counted value indicating an angle within 0 to 360 degrees as an angular signal S1. The pulses to be counted are input according to a resolution indicating the angular changes, and more concretely, the pulses are input continuously or discontinuously according to the angular changes θ (ωt).

Or, the angular data generation portion 1 includes a first counter for counting the pulses indicating angular changes at every 45 degrees and a three-bit second counter for counting carry-overs that are generated by the first counter as a carry-over signal each time the first counter has counted pulses for 45 degrees.

Address Data, Address Selection Signal, Waveform Data Selection Signal, Polarity Processing Signal The angular signal S1 is composed of an n-bit binary low order counted value of, for example, 0000-xxxx at every angular section of 45 degrees illustrated in FIG. 4D, and a three-bit binary high order counted value, illustrated in FIG. 4E which is carried-up eight times in response to the angular section of ①–⑧ at every update of the angular sections.

The low order counted value is reset at every angular section, i.e. every 45 degrees, as illustrated in FIG. 4D to change within the range of, for example, 0000 to xxxx. The low order counted value illustrated in FIG. 4D is used as an address data S2 for reading a waveform data from the first and the second waveform data storage portions 3a and 3b.

The high order three bits indicate 000–111 in binary and 0–7 in decimal to denote the angular sections ①–⑧. As illustrated in FIG. 4C, high order two bits composed of the MSB and the next high order bit among the high order three bits are used as a polarity processing signal S5 in the polarity processing portion 5. Two bits next to the MSB among the high order three bits are used as a waveform data selection signal S4 in the waveform data selection portion 4. The second bit from the MSB among the three bits is used as an address selection signal S3 in the address data selection portion 2. The high order three bits, the address selection signal S3, the waveform selection signal S4 and the polarity processing signal S5 are shown in FIGS. 4E to 4H, respectively.

That is, the high order three bits are used for the reading process from the first and the second waveform data storage portions 3a and 3b storing waveform data for 45 degrees in response to the angular sections illustrated in FIG. 2, and the angular section processing and the polarity processing of the read waveform data.

Address Data Selection Portion

The address data selection portion 2 includes a first and a second logical value inversion portions INV1 and INV2, and a first and a second selectors SEL1 and SEL2.

The logical value inversion portions INV1 and INV2 are composed of an inverter circuit, and logically invert the address data S2. Inverting the logical value of each bit in the logical value inversion portions INV1 and INV2 is equivalent to the value of the address data S2 subtracted from the maximum value of the address data S2 having a logical value "1" in all of the bits thereof. For example, if an address data S2 of seven bits is "20" in the case where the address data S2 changes within the range of "0" to "63", the output data value of the logical value inversion portions INV1 and INV2 is a value "43(=63 −20)". Consequently, when the address data S2 increases from the minimum value to the maximum value M as shown in FIG. 4D, the output data of the logical value inversion portions INV1 and INV2 decrease from the maximum value M to the minimum value.

The address data S2 is input into a terminal a of the selector SEL1 and a terminal b of the selector SEL2. The bits of the address data S2 are inverted by the logical value inversion portion INV1 and input into a terminal b of the selector SEL1. The bits of the address data S2 are inverted by the logical value inversion portion INV2 and input into a terminal a of the selector SEL2.

The selectors SEL1 and SEL2 select and output an input signal to the terminal a when the address selection signal S3 takes a logical value "0", and select and output an input signal to the terminal b when the address selection signal S3 takes a logical value "1".

Data output from the selector SEL1 are supplied to the waveform data storage portion 3a as a read address S6, and data output from the selector SEL2 are supplied to the waveform data storage portion 3b as a read address S7.

Reading Data in First and Second Waveform Data Storage Portions

FIG. 5 is a diagram showing the reading direction of waveform data from the first and the second waveform data storage portions 3a and 3b at every angular section illustrated in FIG. 2. A mark "forward" indicates the reading direction of data in the case where the bit inversion (angular conversion) of the address data S2 has not been performed in the address data selection portion 2, and a mark "backward" indicates the reading direction of data in the case where the bit inversion of the address data S2 has been performed in the address data selection portion 2, severally.

In the angular sections ①–⑧, in accordance with the logical values of the address selection signal S3, the reading direction of data from the waveform data storage portion 3a is alternatively "forward (or positive)", "backward", . . . , "forward", and "backward", and the reading direction of data from the waveform data storage portion 3b is alternatively "backward", "forward", . . . , "backward", and "forward".

Waveform Data Selection Portion

The waveform data selection portion 4 includes selectors SEL3 and SEL4 that select and output input signals in response to the waveform data selection signal S4.

A waveform data S8 read from the waveform data storage portion 3a is input into a terminal a of the selector SEL3, and a waveform data S9 read from the waveform data storage portion 3b is input into a terminal b of the selector SEL3. The waveform data S9 is input into a terminal a of the selector SEL4, and the waveform data S8 is input into a terminal b of the selector SEL4.

The selectors SEL3 and SEL4 select and output an input signal of the terminal a when the waveform data selection signal S4 takes logical values "00" and "11", and the selectors SEL3 and SEL4 select and output an input signal of the terminal b when the waveform data selection signal S4 takes logical values "01" and "10".

A sine wave waveform data S10 is output from the selector SEL 3 and input into the polarity processing portion 5, and a cosine wave waveform data S11 is output from the selector SEL 4 and input into the polarity processing portion 5.

FIG. 6 is a diagram showing the waveform data storage portions 3a and 3b serving as sources of the first and the second waveform data S10 and S11, at every angular section illustrated in FIG. 2. A mark "<1>" indicates the waveform data storage portion 3a. A mark "<2>" indicates the waveform data storage portion 3b.

As the waveform data S10, the waveform data from the waveform data storage portions 3a, 3b, 3b and 3a are respectively selected in each angular sections ①–④, and the waveform data from the waveform data storage portions 3a, 3b, 3b and 3a are respectively selected in each angular sections ⑤–⑧. These selections are repeated.

As the waveform data S11, the waveform data from the waveform data storage portions 3b, 3a, 3a and 3b are respectively selected in each angular sections ①–④, and the waveform data from the waveform data storage portions 3b, 3a, 3a and 3b are respectively selected in each angular sections ⑤–⑧. These selections are repeated.

Polarity Processing Portion

The polarity processing portion 5 includes a polarity inversion portion 5a, a polarity inversion portion 5b, a selector SEL5 and a selector SEL6.

The polarity inversion portion 5a inverts the polarity of the sine waveform data S10.

The polarity inversion portion 5b inverts the polarity of the cosine waveform data S11.

The selector SEL5 selects the waveform data S10 when the polarity processing signal S5 takes logical values "00" and "01", and selects an output signal of the polarity inversion portion 5a when the polarity processing signal S5 takes logical values "10" and "11", outputting the selected signal as a sine wave data Dsinωt.

The selector SEL6 selects the cosine waveform data S11 when the polarity processing signal S5 takes logical values "00" and "11", and selects an output signal of the polarity inversion portion 5b when the polarity processing signal S5 takes logical values "01" and "10", outputting the selected signal as a cosine wave data Dcosωt.

FIG. 7 is a diagram showing the polarities of the sine wave data Dsin and the cosine wave data Dcos that are set in the polarity processing portion 5 at every angular section illustrated in FIG. 2. A mark "+" indicates the case where the polarities of the first and the second waveform data S10 and S11 are not inverted, and a mark "−" indicates the case where the polarities are inverted.

In the angular sections ①–④, the waveform data S10 is output without its polarity inverted and as it is as the sine wave data Dsinωt. In the angular sections ⑤–⑧, the waveform data S10 is output after the polarity thereof has been inverted as the sine wave data Dsinωt.

In the angular sections ⑦, ⑧, and ②, the waveform data S11 is output without its polarity inverted but as it is as the cosine wave data Dcosωt. In the angular sections ③–⑥, the waveform data S11 is output after the polarity thereof has been inverted as the cosine wave data Dcosωt.

In such a way, the polarity processing portion 5 adjusts the polarities of the sine waveform data S10 and the cosine waveform data S11 output from the waveform data selection portion 4 to be positive or negative, respectively, in response to the polarity processing signal S5, and outputs the adjusted sine waveform data S10 and the cosine waveform data S11 as the sine wave data Dsinωt and the cosine wave data Dcosinωt, respectively, in response to the angular sections.

The operation of the waveform data generation apparatus 100 of FIG. 1 will be described with reference to FIG. 8 and FIG. 9

Reading Sine Wave Data

Figure 8:
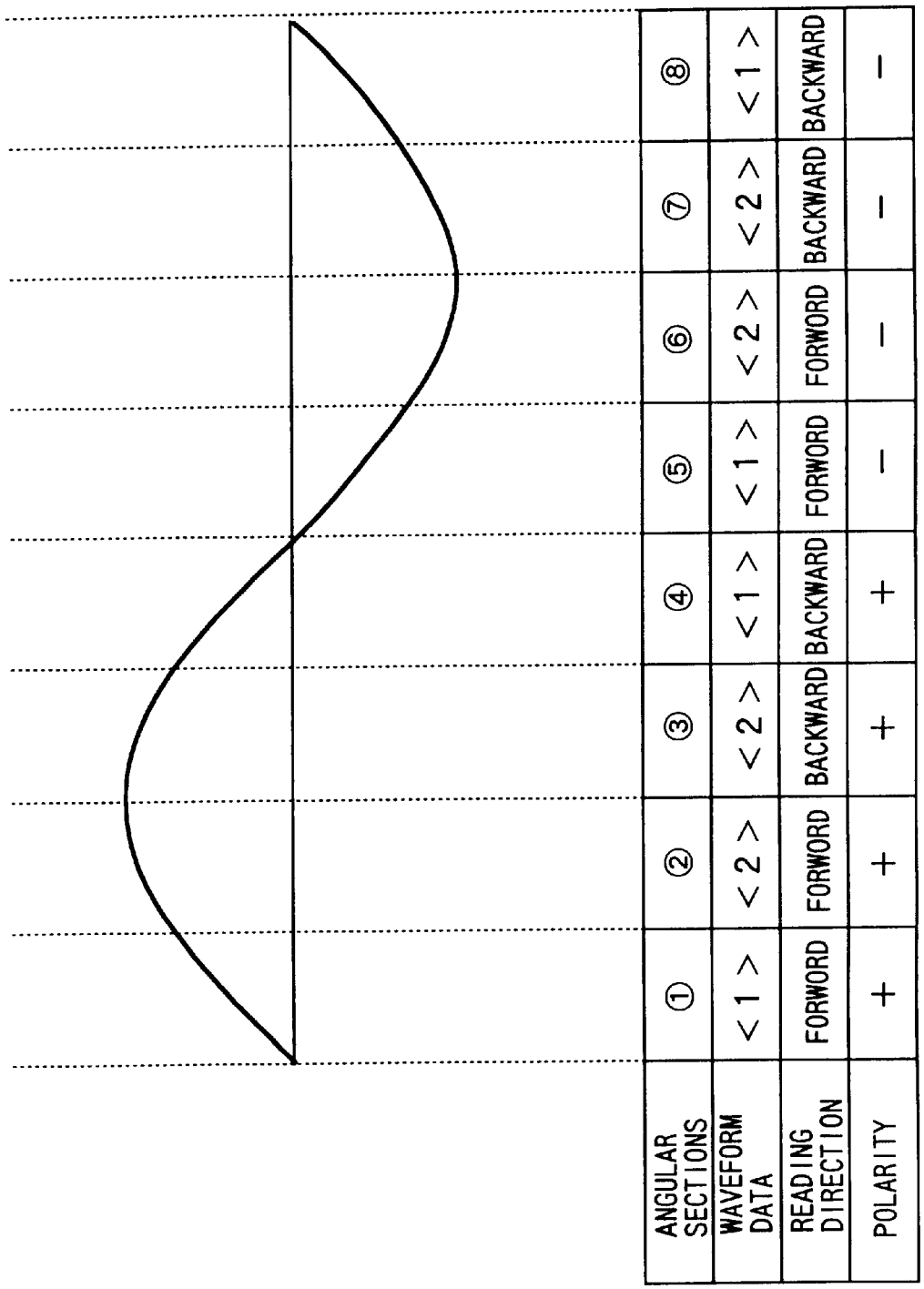
FIG. 8 is a diagram illustrating the reading direction and the polarity of sine wave waveform data read from the first and the second waveform data storage portions illustrated in FIG. 1 in response to address data.

FIG. 8 is a diagram illustrating the reading direction and the polarity of the sine wave waveform data Dsinωt read from the first and the second waveform data storage portions 3a and 3b in response to the address data S2.

In the angular section ①, the address data S2 is supplied as it is from the selector SEL1 in the address data selection portion 2 to the waveform data storage portion 3a as the read address S6, so that sine wave data in the range 0–45 degrees is read from the minimum value thereof to the maximum value thereof in the forward direction (see FIG. 5). The read waveform data are selected by the waveform data selection portion 4 as the waveform data S10 (see FIG. 6). The selected waveform data S10 is output as it is as the sine wave data Dsinωt (see FIG. 7).

In the angular sections ②–⑧, processing similar to the processing described above is performed.

In the angular section ②, waveform data in the range 45–90 degrees read from the waveform data storage portion 3b in the forward direction are output as the sine wave data Dsinωt.

In the angular section ③, waveform data read from the waveform data storage portion 3b in the backward direction are output as the sine wave data Dsinωt.

In the angular section ④, waveform data read from the waveform data storage portion 3a in the backward direction are output as the sine wave data Dsinωt.

In the angular section ⑤, waveform data read from the waveform data storage portion 3a in the forward direction are output as the sine wave data Dsinωt with its polarity inverted.

In the angular section ⑥, waveform data read from the waveform data storage portion 3b in the forward direction are output as the sine wave data Dsinωt with its polarity inverted.

In the angular section ⑦, waveform data read from the waveform data storage portion 3b in the backward direction are output as the sine wave data Dsinωt with its polarity inverted.

In the angular section ⑧, waveform data read from the waveform data storage portion 3a in the backward direction are output as the sine wave data Dsinωt with its polarity inverted.

Reading Cosine Wave Data

Figure 9:
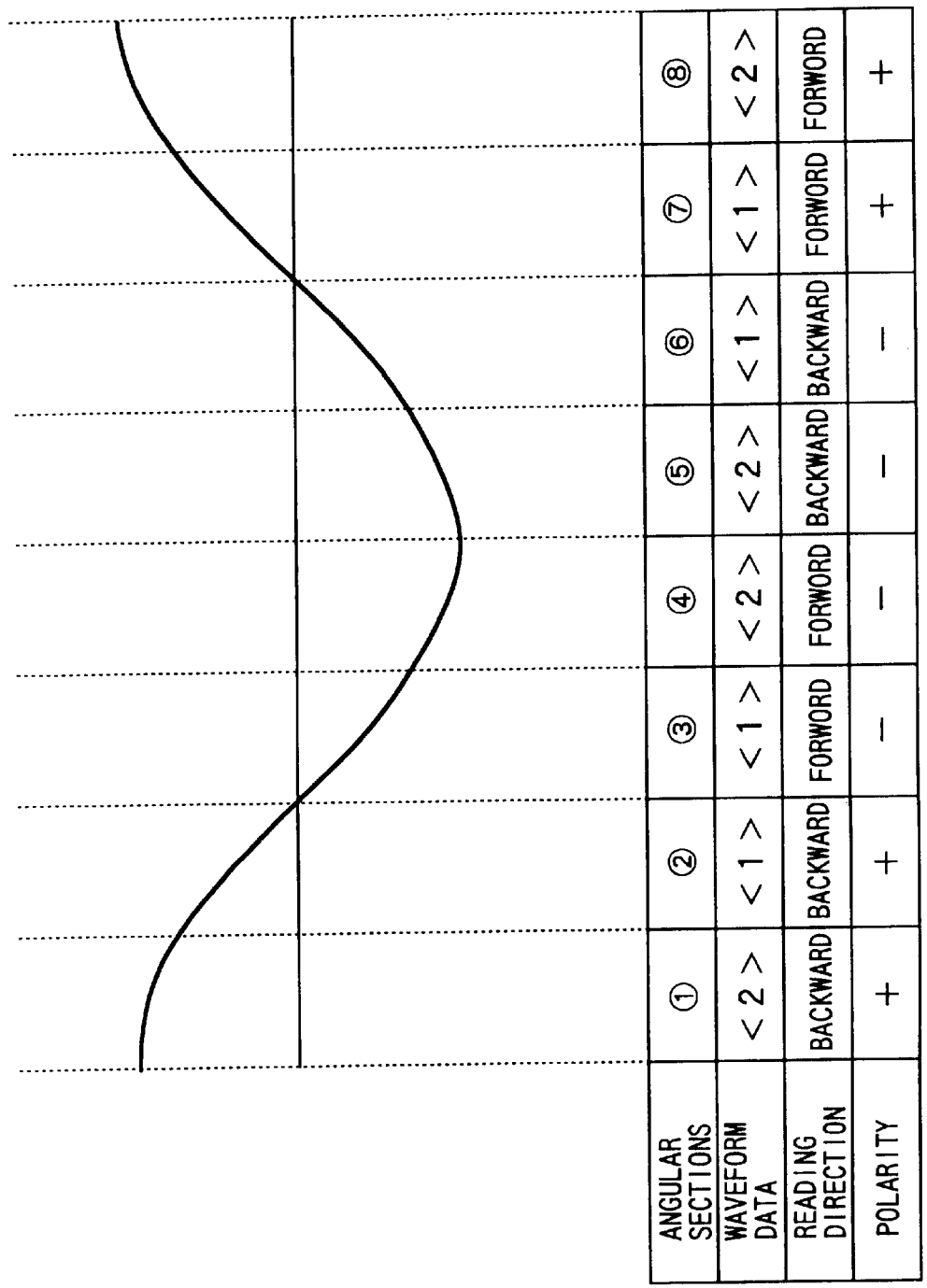
FIG. 9 is a diagram illustrating the reading direction and the polarity of cosine wave waveform data read from the first and the second waveform data storage portions illustrated in FIG. 1 in response to the address data.

FIG. 9 is a diagram illustrating the reading direction and the polarity of a cosine wave waveform data Dcosωt read from the first and the second waveform data storage portions 3a and 3b in response to the address data S2.

In the angular section ①, waveform data read from the waveform data storage portion 3b in the backward direction are output as the cosine wave data Dcosωt.

In the angular section ②, waveform data read from the waveform data storage portion 3a in the backward direction are output as the cosine wave data Dcosωt.

In the angular section ③, waveform data read from the waveform data storage portion 3a in the forward direction are output as the cosine wave data Dcosωt with its polarity inverted.

In the angular section ④, waveform data read from the waveform data storage portion 3b in the forward direction are output as the cosine wave data Dcosωt with its polarity inverted.

In the angular section ⑤, waveform data read from the waveform data storage portion 3b in the backward direction are output as the cosine wave data Dcosωt with its polarity inverted.

In the angular section ⑥, waveform data read from the waveform data storage portion 3a in the backward direction are output as the cosine wave data Dcosωt with its polarity inverted.

In the angular section ⑦, waveform data read from the waveform data storage portion 3a in the forward direction are output as the cosine wave data Dcosωt.

In the angular section ⑧, waveform data read from the waveform data storage portion 3b in the forward direction are output as the cosine wave data Dcosωt.

In the waveform data generation apparatus 100 shown in FIG. 1, because only the sine wave data in the range 0–45 degrees and the sine wave data in the range 45–90 degrees are stored in the first and the second waveform data storage portions 3a and 3b, the storage capacities of the first and the second waveform data storage portions 3a and 3b are small.

For example, in the case where data are stored in the first and the second waveform data storage portions 3a and 3b on the supposition that an angular resolution is 1 degree and that sine wave data from 0 to 1 are eight-bit data ($0-2^8$= 0–255) from 00000000 to 11111111, the storage capacities of the first and the second waveform data storage portions 3a and 3b become 45 bytes severally. If the angular resolution is set to be 2 degrees, the storage capacities of the first and the second waveform data storage portions become 23 bytes severally. When the storage capacitors become smaller as such, the first and the second waveform data storage portions 3a and 3b can be realized by a nonvolatile static random access memory (SRAM) as well as a ROM, and thereby data can be read out at a high speed from the first and the second storage portions 3a and 3b.

Because the angular data generation portion 1 can be realized by means of a simple counter circuit, the circuit configuration thereof is very simple.

The logical value inversion portions INV1 and INV2, the selectors SEL1 and SEL2, the polarity inversion portions 5a and 5b, and the selectors SEL5 and SEL6 can also be realized by the use of simple circuits.

Thus, the waveform data generation apparatus 100 can be configured with very simple circuits.

Consequently, the whole of the waveform data generation apparatus 100 can also be configured to be a one-chip integrated circuit.

Second Embodiment

Although the sine wave waveform data in the ranges 0–45 degrees and 45 to 90 degrees, which is exemplified in FIG. 3, are stored in the first and the second waveform data storage portions 3a and 3b in the waveform data generation apparatus 100 of FIG. 1, the combinations of the waveform data are not limited thereto.

The absolute values of the sine waveforms in the angular sections ①, ④, ⑤ and ⑧ are the same. The absolute values of the sine waveforms in the angular sections ②, ③, ⑥ and ⑦ are the same. Accordingly, the sine waveform data in any one of the angular sections ①, ④, ⑤ and ⑧, and the sine waveform data in any one of the angular sections ②, ③, ⑥ and ⑦ can arbitrarily be selected as two types of waveform data to be stored in the waveform data storage portions 3a and 3b.

That is, the waveform data to be stored in the first and the second waveform data storage portions 3a and 3b are, besides the ones shown in FIG. 3, as shown in FIGS. 10 and 17, (1) sine wave data or cosine wave data in either of the angular sections on both sides of a zero-crossing point of a sine wave or a cosine wave, each of the angular sections being defined by 45 degrees of an angular which is defined out of eight sections equally divided by an angle range 0–360 degrees on the basis 0 degree, and (2) sine wave data or cosine wave data in an angular section adjacent to the angular section. The two data form a sine waveform data or cosine waveform data in a range 0–90 degrees substantially when the two data are synthesized.

By suitably setting the operations of the address data selection portion 2, the waveform data selection portion 4 and the polarity processing portion 5 of the address selection signal S3, and the waveform data selection signal S4 and the polarity processing signal S5 in response to the selected two kinds of waveform data, a sine wave data Dsinωt and a cosine wave data Dcosωt can be simultaneously generated as in the first embodiment.

The case is described where a waveform data generation apparatus as an example of a second embodiment of the present invention stores the waveform data of a cosine wave in the angular section in a rage 0 to 45 degrees into the waveform data storage portion 3a and stores the waveform data of a cosine wave in the angular section in a rage 45 to 90 degrees into the waveform data storage portion 3b as illustrated in FIG. 10.

The angular data generation portion 1, the address data selection portion 2 and the polarity processing portion 5 are the same as those in the first embodiment.

As illustrated in FIG. 11, the selection operation of the waveform data selection portion 4 in response to the waveform data selection signal S4 differs from that shown in FIG. 6.

FIG. 11 is a diagram showing the waveform data storage portions 3a and 3b serving as sources of the first and the second waveform data S10 and S11 in the waveform data generation apparatus 100A of the second embodiment of the present invention at every angular section illustrated in FIG. 2.

The data output from the waveform data storage portions 3b, 3a, 3a and 3b are selected as the sine wave data S10 in the angular sections ①–④, respectively, and similar selections are repeated in the angular sections ⑤–⓪. The data output from the waveform data storage portions 3a, 3b, 3b and 3a are selected as the cosine wave data S11 in the angular sections ①–④, respectively, and similar selections are repeated in the angular sections ⑤–⑧.

The selectors SEL3 and SEL4 select and output an input signal to the terminal a when the waveform data selection signal S4 takes logical values "01" and "10" and select and output an input signal to the terminal b when the waveform data selection signal S4 takes logical values "00" and "11".

Reading Sine Wave Data

Figure 12:
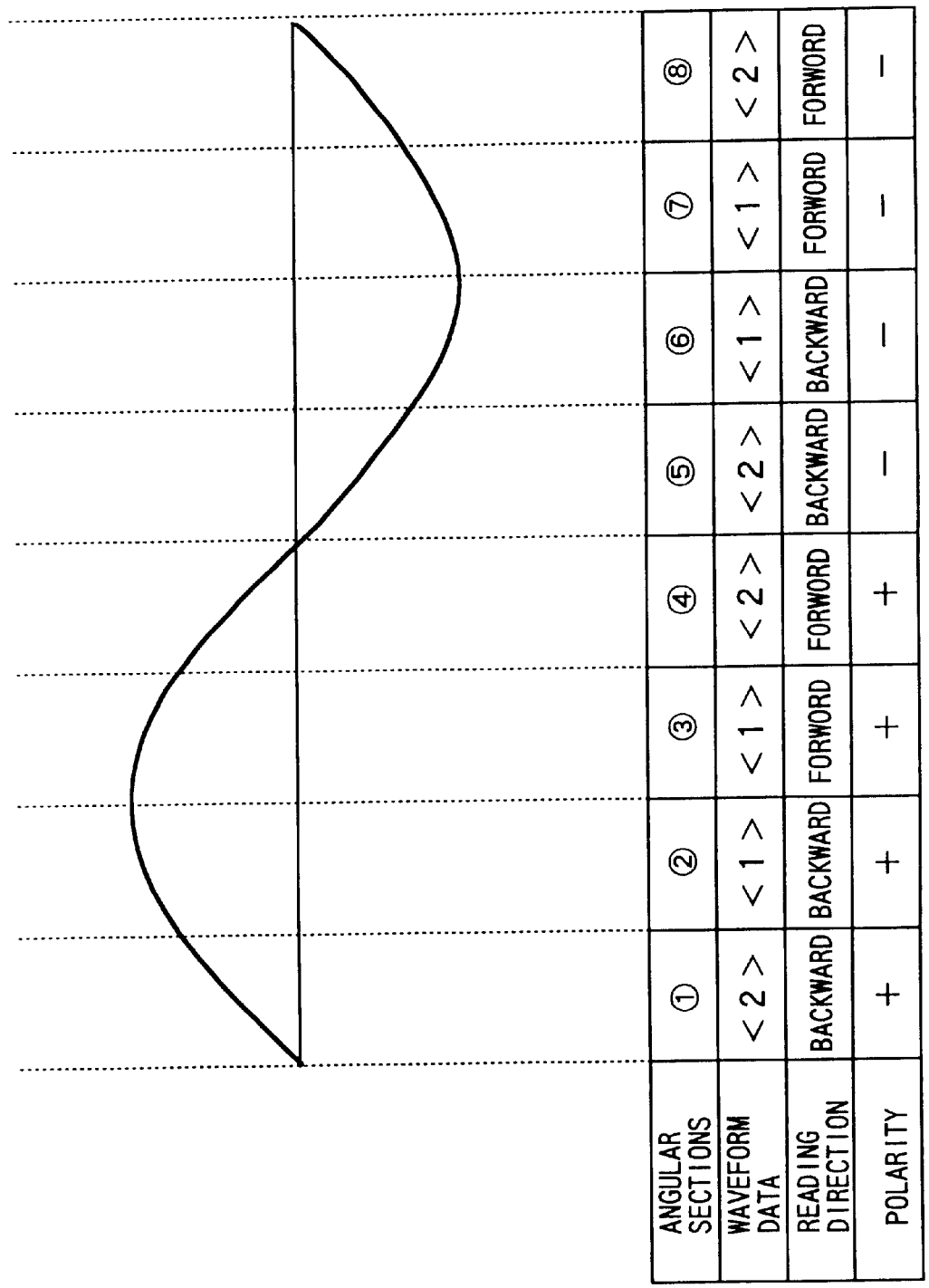
FIG. 12 is a diagram illustrating the reading direction and the polarities of the waveform data of a sine wave read from a waveform data storage portion in the waveform data generation apparatus of the second embodiment of the present invention in response to the address data.

FIG. 12 is a diagram illustrating the reading direction and the polarity of a sine wave waveform data Dsinωt read from the first and the second waveform data storage portions 3a and 3b in the waveform data generation apparatus 100 of the second embodiment in response to the address data S2.

In the angular section ①, waveform data read from the waveform data storage portion 3b in the backward direction are output as the sine waveform data Dsinωt.

In the angular section ②, waveform data read from the waveform data storage portion 3a in the backward direction are output as the sine wave data Dsinωt.

In the angular section ③, waveform data read from the waveform data storage portion 3a in the forward direction are output as the sine wave data Dsinωt.

In the angular section ④, waveform data read from the waveform data storage portion 3b in the forward direction are output as the sine wave data Dsinωt.

In the angular section ⑤, waveform data read from the waveform data storage portion 3b in the backward direction are output as the sine wave data Dsinωt with its polarity inverted.

In the angular section ⑥, waveform data read from the waveform data storage portion 3a in the backward direction are output as the sine wave data Dsinωt with its polarity inverted.

In the angular section ⑦, waveform data read from the waveform data storage portion 3a in the forward direction are output as the sine wave data Dsinωt with its polarity inverted.

In the angular section ⑧, waveform data read from the waveform data storage portion 3b in the forward direction are output as the sine wave data Dsinωt with its polarity inverted.

Reading Cosine Wave Data

Figure 13:
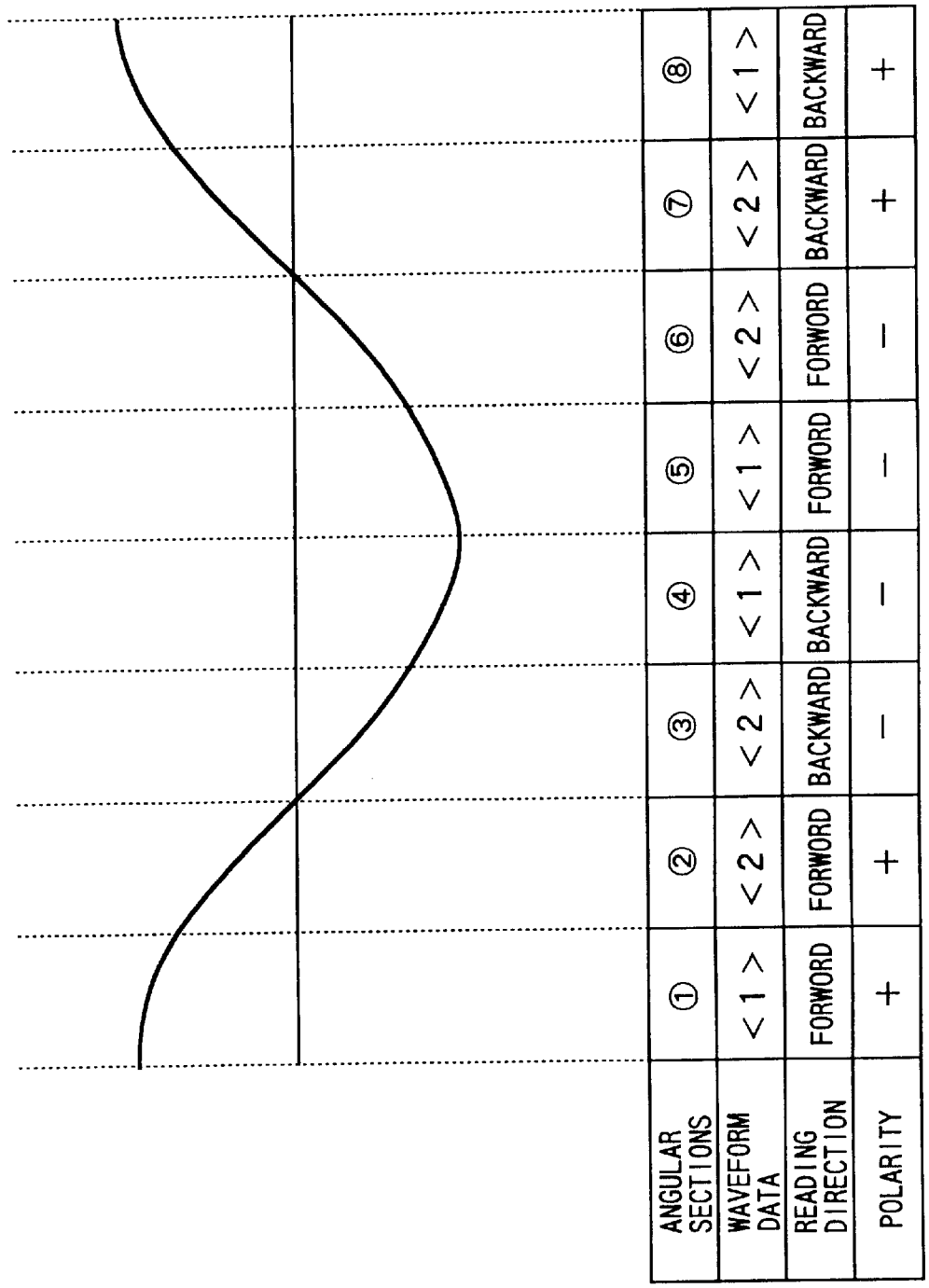
FIG. 13 is a diagram illustrating the reading direction and the polarities of the waveform data of a cosine wave read from the waveform data storage portion in the waveform data generation apparatus of the second embodiment of the present invention in response to the address data.

FIG. 13 is a diagram illustrating the reading direction and the polarity of a cosine wave waveform data Dcosωt read from the first and the second waveform data storage portions 3a and 3b in the waveform data generation apparatus 100 of the second embodiment in response to the address data S2.

In the angular section ①, waveform data read from the waveform data storage portion 3a in the forward direction are output as the cosine wave data Dcosωt.

In the angular section ②, waveform data read from the waveform data storage portion 3b in the forward direction are output as the cosine wave data Dcosωt.

In the angular section ③, waveform data read from the waveform data storage portion 3b in the backward direction are output as the cosine wave data Dcosωt with its polarity inverted.

In the angular section ④, waveform data read from the waveform data storage portion 3a in the backward direction are output as the cosine wave data Dcosωt with its polarity inverted.

In the angular section ⑤, waveform data read from the waveform data storage portion 3a in the forward direction are output as the cosine wave data Dcosωt with its polarity inverted.

In the angular section ⑥, waveform data read from the waveform data storage portion 3b in the forward direction are output as the cosine wave data Dcosωt with its polarity inverted.

In the angular section ⑦, waveform data read from the waveform data storage portion 3b in the backward direction are output as the cosine wave data Dcosωt.

In the angular section ⑧, waveform data read from the waveform data storage portion 3a in the backward direction are output as the cosine wave data Dcosωt.

Even in this case where the waveform data of a cosine wave in the angular sections in the ranges from 0 to 45 degrees and from 45 to 90 degrees are stored in the first and the second waveform data storage portions 3a and 3b in such a manner, the sine wave data Dsinωt and the cosine wave data Dcosωt can be generated in the waveform data generation apparatus 100 of FIG. 1.

Third Embodiment

A waveform data generation apparatus of a third embodiment of the present invention will be described with reference to FIG. 14.

Figure 14:
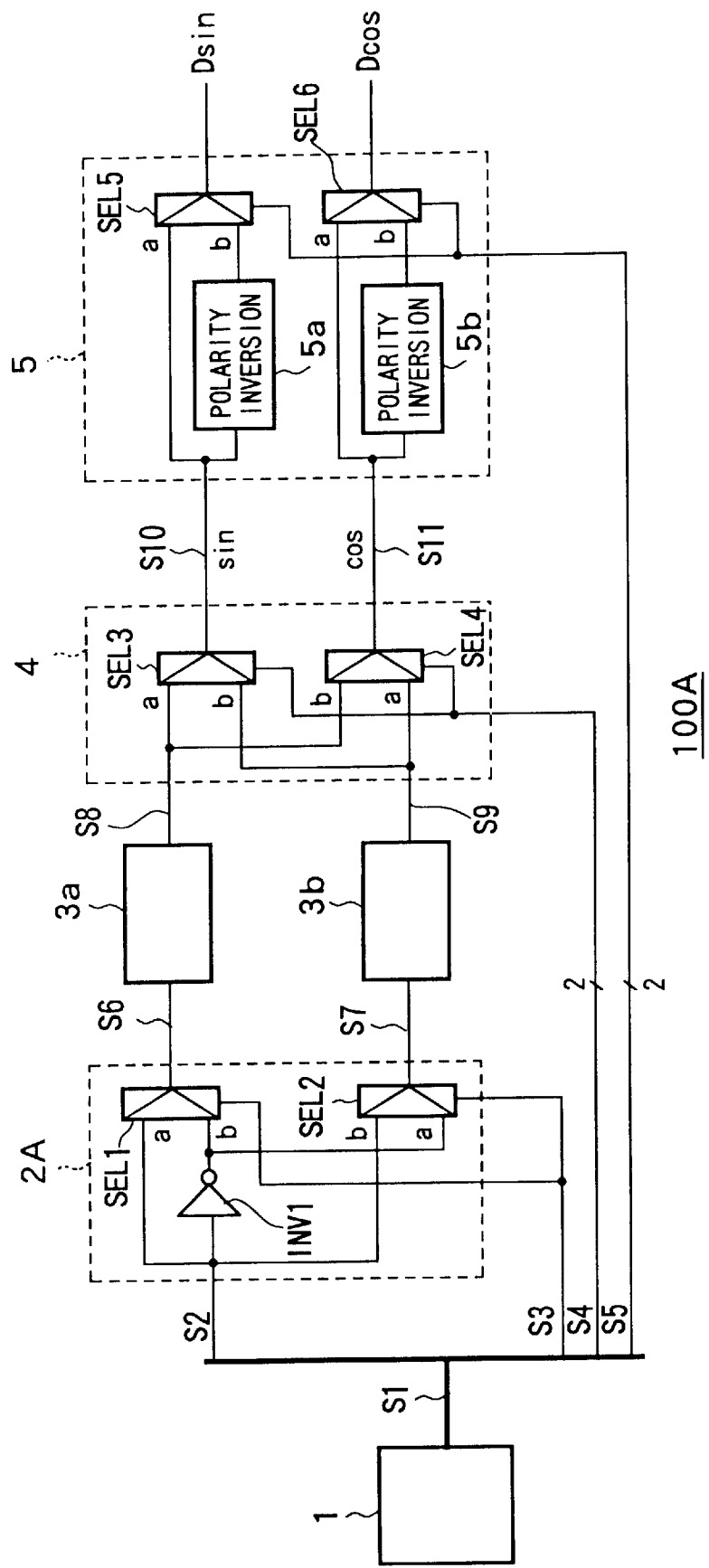
FIG. 14 is a block diagram showing a configuration example of a waveform data generation apparatus according to a third embodiment of the present invention.

FIG. 14 is a block diagram showing a configuration example of a waveform data generation apparatus 100A according to the third embodiment of the present invention.

In the waveform data generation apparatus 100A, the circuit of the address data selection portion 2 in the waveform data generation apparatus 100 illustrated in FIG. 1 is simplified. That is, in the waveform data generation apparatus 100A, the address data selection portion 2 of the waveform data generation apparatus 100 illustrated in FIG. 1 is replaced with an address data selection portion 2A.

The other first and second waveform data storage portions 3a and 3b, the waveform data selection portion 4 and the polarity processing portion 5 are the same as those illustrated in FIG. 1.

In the address data selection portion 2A, the logical value inversion portion INV2 of the address data selection portion 2 in FIG. 1 is deleted, and the output data of the logical value inversion portion INV1 is input into the terminal a of the selector SEL2.

Although the waveform data generation apparatus 100A differs from the waveform data generation apparatus 100 in its configuration as described above, because the operations of the address data selection portion 2 and the address data selection portion 2A to the address selection signal S3 are quite the same, the waveform data generation apparatus 100A operates similarly as the waveform data generation apparatus 100.

Since the logical value inversion portion INV2 is omitted, the waveform data generation apparatus 100A can make its circuit size smaller than that of the waveform data generation apparatus 100.

Fourth Embodiment

A waveform data generation apparatus of a fourth embodiment of the present invention will be described with reference to FIG. 15.

Figure 15:
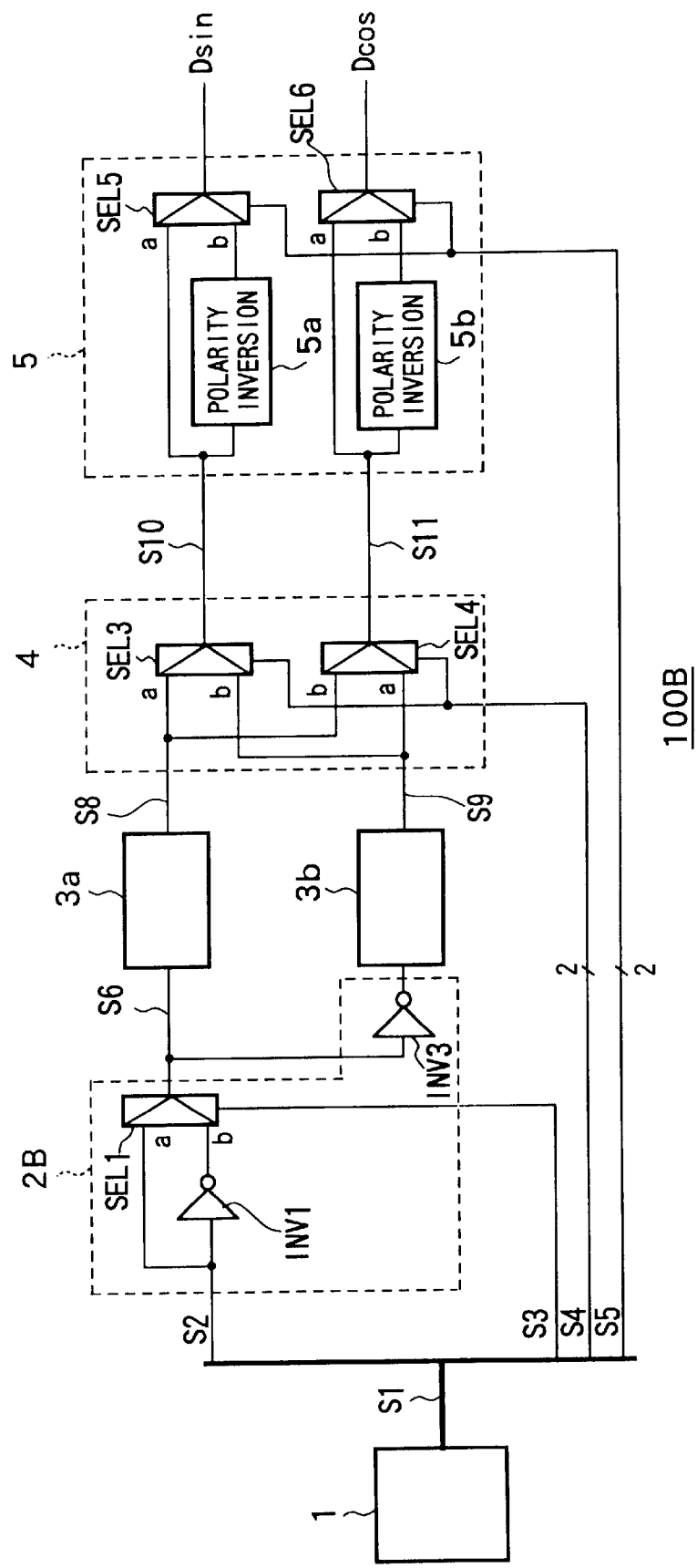
FIG. 15 is a block diagram showing a configuration example of a waveform data generation apparatus according to a fourth embodiment of the present invention.

FIG. 15 is a block diagram showing a configuration example of a waveform data generation apparatus 100B according to the fourth embodiment of the present invention.

In the waveform data generation apparatus 100B, the circuit of the address data selection portion 2 in the waveform data generation apparatus 100 illustrated in FIG. 1 is replace with an address data selection portion 2B which is further simplified.

The other first and second waveform data storage portions 3a and 3b, the waveform data selection portion 4 and the polarity processing portion 5 are substantially the same as those illustrated in FIG. 1.

In the address data selection portion 2B, the selector SEL2 and the logical value inversion portion INV2 of the address data selection portion 2 in FIG. 1 are deleted. The read address S6 output from the selector SEL 2 is directly input into the waveform data storage portion 3a and is also input into the waveform data storage portion 3b after the bits thereof are inverted by a logical value inversion portion INV3.

As seen from the illustration of FIG. 5, when one of the waveform data storage portions 3a and 3b is read in the forward direction, the other waveform data storage portion is read in the backward direction. That is, the address data S2 input into each of the waveform data storage portion 3a and 3b are in the relation in which logical values at the same bit are inverted to each other. Consequently, even if the read address S6 to be supplied to the waveform data storage portion 3a is supplied to the waveform data storage portion 3b after being inverted as in the address data selection portion 2B, the operation becomes the same as that of the address data selection portion 2 illustrated in FIG. 1.

Consequently, the waveform data generation apparatus 100B illustrated in FIG. 15 operates in the same way as the waveform data generation apparatus 100 illustrated in FIG. 1.

Since the selector SEL2 is deleted in the waveform data generation apparatus 100B illustrated in FIG. 15, the circuit size thereof can be made smaller than that of the waveform data generation apparatus 100.

Fifth Embodiment

A waveform data generation apparatus of a fifth embodiment of the present invention will be described with reference to FIG. 16.

Figure 16:
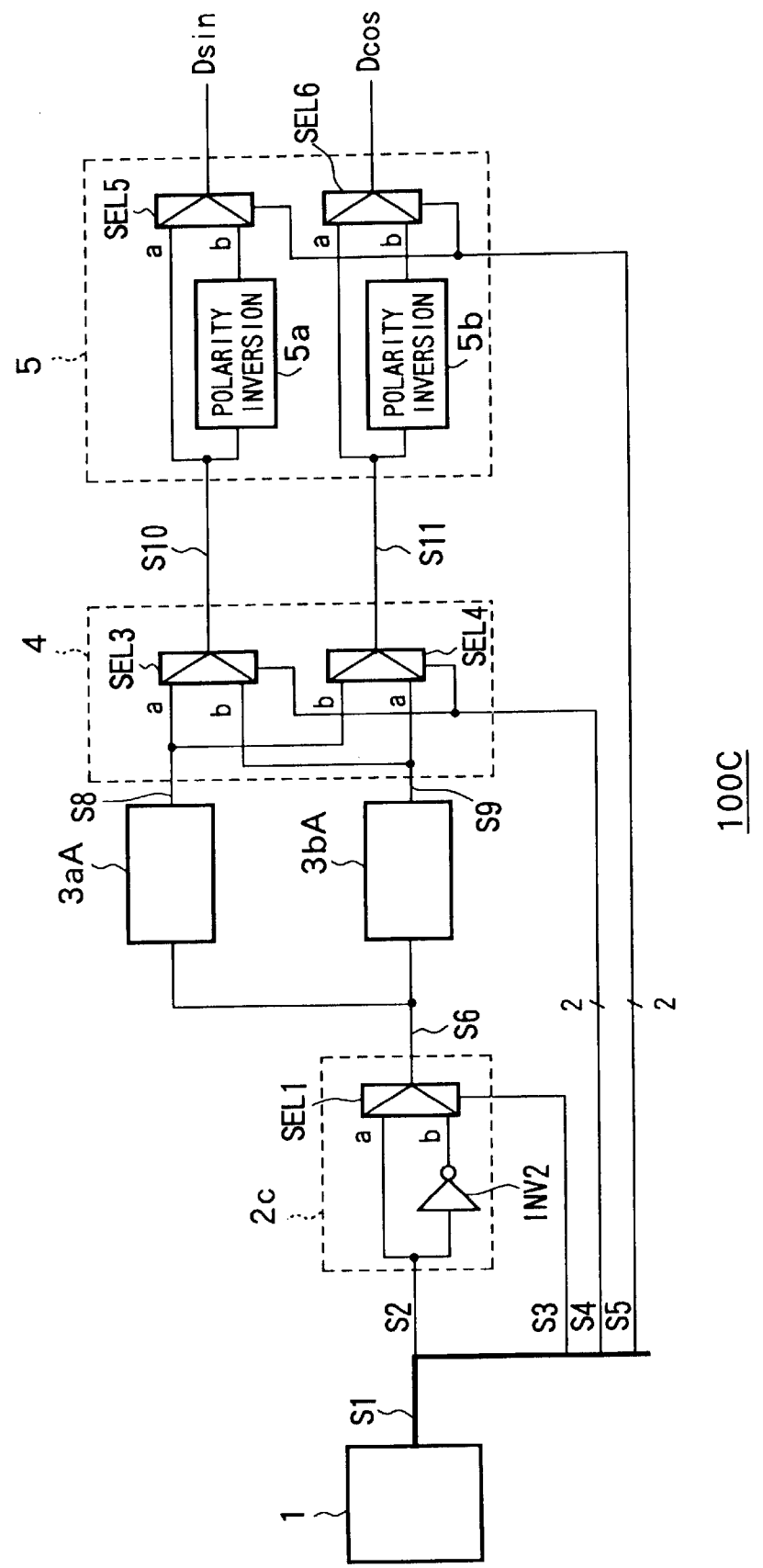
FIG. 16 is a block diagram showing a configuration example of a waveform data generation apparatus according to a fifth embodiment of the present invention.

FIG. 16 is a block diagram showing a configuration example of a waveform data generation apparatus 100C according to the fifth embodiment of the present invention. In the waveform data generation apparatus 100C, the address data selection portion 2 illustrated in FIG. 1 is replaced with an address data selection portion 2C, and the first and the second waveform data storage portions 3a and 3b are replaced with a first and a second waveform data storage portions 3aA and 3bA, respectively.

The others, the waveform data selection portion 4 and the polarity processing portion 5 are substantially the same as those illustrated in FIG. 1.

The first and the second waveform data storage portions 3aA and 3bA store, for example, the waveform data of a sine wave in the angular section ① (0°–45°) shown in FIG. 17 and the waveform data of a cosine wave in the angular section ① (0°–45°), respectively. The angular sections of the sine wave and the cosine wave of the data to be stored in the first and the second waveform data storage portions 3aA and 3bA may be shifted 180° from each other. For example, in the case where the waveform data storage portion 3aA stores the waveform data of the sine wave in the angular section ① (0°–45°), the waveform data storage portion 3bA may store the waveform data of the cosine wave in the angular section ⑤ (180°–225°).

In the address data selection portion 2C, the logical value inversion portion INV2 and the selector SEL2 in the address data selection portion 2 in FIG. 1 are deleted, and the read address S6 output from the selector SEL1 is supplied as it is to the waveform data storage portion 3aA and the waveform data selection portion 3bA.

FIG. 18 is a diagram showing the reading direction of the waveform data from the first and the second waveform data storage portions 3aA and 3bA of the waveform data generation apparatus 100C at every angular section illustrated in FIG. 2.

The reading directions of the waveform data from the first and the second waveform data storage portions 3aA and 3bA are the same in the same angular sections.

Reading Sine Wave Data

Figure 19:
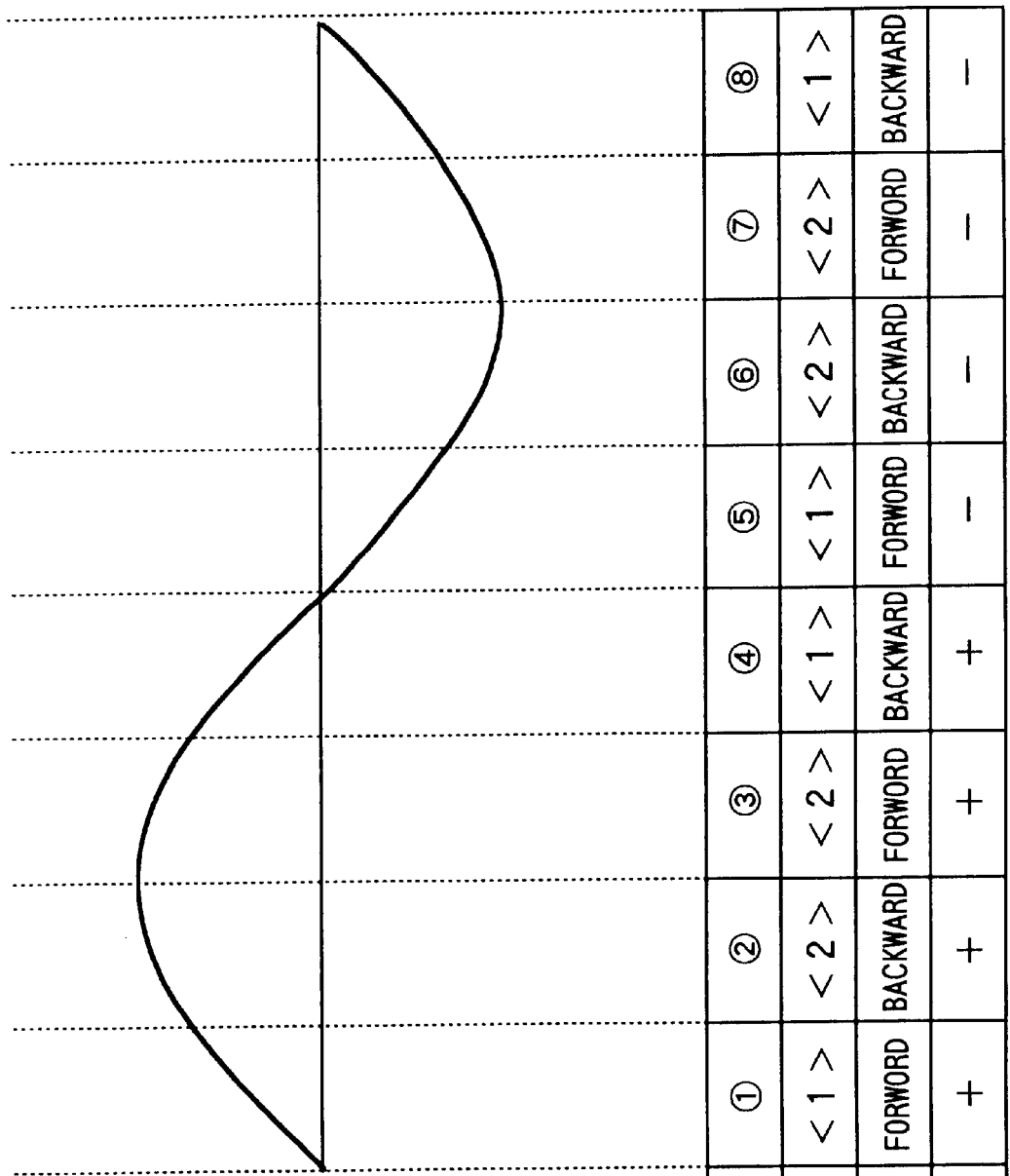
FIG. 19 is a diagram illustrating the reading direction and the polarities of the waveform data of a sine wave read from the waveform data storage portion in the waveform data generation apparatus of the fifth embodiment of the present invention in response to a read address.

FIG. 19 is a diagram illustrating the reading direction and the polarity of a sine wave waveform data Dsinωt read from the first and the second waveform data storage portions 3aA and 3bA in the waveform data generation apparatus 100C of the fifth embodiment in response to the read address S6.

In the angular section ①, waveform data read from the waveform data storage portion 3aA in the forward direction are output as the sine waveform data Dsinωt.

In the angular section ②, waveform data read from the waveform data storage portion 3bA in the backward direction are output as the sine wave data Dsinωt.

In the angular section ③, waveform data read from the waveform data storage portion 3bA in the forward direction are output as the sine wave data Dsinωt.

In the angular section ④, waveform data read from the waveform data storage portion 3aA in the backward direction are output as the sine wave data Dsinωt.

In the angular section ⑤, waveform data read from the waveform data storage portion 3aA in the forward direction are output as the sine wave data Dsinωt with its polarity inverted.

In the angular section ⑥, waveform data read from the waveform data storage portion 3bA in the backward direction are output as the sine wave data Dsinωt with its polarity inverted.

In the angular section ⑦, waveform data read from the waveform data storage portion 3bA in the forward direction are output as the sine wave data Dsinωt with its polarity inverted.

In the angular section ⑧, waveform data read from the waveform data storage portion 3aA in the backward direction are output as the sine wave data Dsinωt with its polarity inverted.

Reading Cosine Wave Data

FIG. 20 is a diagram illustrating the reading direction and the polarity of a cosine wave waveform data Dcosωt read from the first and the second waveform data storage portions 3aA and 3bA in the waveform data generation apparatus 100C of the fifth embodiment in response to the read address S6.

In the angular section ①, waveform data read from the waveform data storage portion 3bA in the forward direction are output as the cosine wave data Dcosωt.

In the angular section ②, waveform data read from the waveform data storage portion 3aA in the backward direction are output as the cosine wave data Dcosωt.

In the angular section ③, waveform data read from the waveform data storage portion 3aA in the forward direction are output as the cosine wave data Dcosωt with its polarity inverted.

In the angular section ④, waveform data read from the waveform data storage portion 3bA in the backward direction are output as the cosine wave data DcosfÖt with its polarity inverted.

In the angular section ⑤, waveform data read from the waveform data storage portion 3bA in the forward direction are output as the cosine wave data Dcosωt with its polarity inverted.

In the angular section ⑥, waveform data read from the waveform data storage portion 3aA in the backward direction are output as the cosine wave data Dcosωt with its polarity inverted.

In the angular section ⑦, waveform data read from the waveform data storage portion 3aA in the forward direction are output as the cosine wave data Dcosωt.

In the angular section ⑧, waveform data read from the waveform data storage portion 3bA in the backward direction are output as the cosine wave data Dcosωt.

As described above, the sine wave data Dsinωt and the cosine wave data Dcosωt can also be simultaneously generated in the waveform data generation apparatus 100Cas in the waveform data generation apparatus 100 illustrated in FIG. 1.

As is apparent from the illustration of FIG. 18, because the reading directions of the waveform data become the same in the waveform data storage portions 3aA and 3bA, read addresses to be output to the waveform data storage portions 3aA and 3bA are made common in the waveform data generation apparatus 100C shown in FIG. 16. Consequently, the circuit configuration of the waveform data generation apparatus 100C can be further simplified in comparison with that of the waveform data generation apparatus 100B illustrated in FIG. 15.

The waveform data generation apparatus of the present invention is not limited to the aforesaid embodiments.

For example, the angular ranges of the waveform data in the waveform data storage portions described in the above-mentioned embodiments are only an example. Waveform data in zero-crossing other angular ranges may be stored in each of the waveform data storage portions.

Although the reading directions of the waveform data are switched between the forward direction and the backward direction using the logical value inversion portions and the selectors in the embodiments described above, the structure in which an up-down counter is used as the angular data generation portion 1 to generate read addresses, and in which the reading directions of the waveform data are switched by the switching of the count-up operation of the up-down counter and the count-down operation thereof may be employed.

In the example illustrated in FIG. 4B, the change of the angular signal S1, which is generated by the angular data generation portion 1, increasing from the minimum value to the maximum value is repeated. On the contrary, the change thereof decreasing from the maximum value to the minimum value may be repeated.

According to the present invention, the number of waveform data to be stored in the waveform data storage portion can be decreased. Moreover, the other circuit configurations are very simple. Consequently, it is possible to form the waveform data generation apparatus of the present invention to be a one-chip semiconductor integrated circuit. As a result, it becomes possible to easily install the waveform data generation apparatus of the present invention into various apparatuses such as a mobile communication apparatus performing quadrature modulation and demodulation, and the like.

Although the invention has been described in its preferred form with a certain degree of particularity, obviously many changes and variations are possible therein. It is, therefore, to be understood that the present invention may be practiced otherwise than as specifically described herein without departing from the scope and the sprit thereof.

What is claimed is:

1. A waveform data generation apparatus for generating sine wave data and cosine wave data according to an angle change within a range 0–360 degrees, said apparatus comprising:

first storage means for storing first sine wave data or first cosine wave data in either of the angular sections on both sides of a zero-crossing point of a sine wave or a cosine wave, each of said angular sections being 45 degrees of an angular range which is defined as one of eight sections equally divided between 0 and 360 degrees on the basis of 0 degree;

second storage means for storing second sine wave data or second cosine wave data in an angular section adjacent to the angular section on which the data stored in said first storage means exists, under a condition that the first sine wave data or the first cosine wave data and the second sine wave data or the second cosine wave data include 0 and a maximum or a minimum thereof;

pulse counting means for counting pulses indicating an angular change and outputting the binary counted value corresponding to an angle within a range 0–360 degrees, said pulse counting means outputting a first counted value to be reset at every angular section and a second counted value being a counted value of a bit carried-up at every reset of the first counted value at every 45 degrees;

read address selection means including angle inversion means for performing an angle inversion of the first counted value on the basis of 45 degrees and first selection means for receiving a first inverted counted value, which is angle-inverted by said angle inversion means, and the first counted value and outputting the received two counted values as a reading address of said first and said second storage means according to the least significant bit of the second counted value;

data selection means including second selection means for receiving the sine wave data and the cosine wave data, which are read out from said first and said second storage means in response to the address output from said read address selection means, and selecting and outputting the sine wave data and the cosine wave data according to the states of two bits of the least significant bit of the second counted value and a higher order bit adjacent to the least significant bit; and polarity processing means including first polarity conversion means for converting a polarity of the sine wave data output from said second selection means, second polarity conversion means for converting a polarity of the cosine wave data output from said second selection means, and third selection means for receiving the sine wave data output from said second selection means, the sine wave data having a polarity converted by said first polarity conversion means, the cosine wave data output from said second selection means, and the cosine wave data having a polarity converted by said second polarity conversion means, and selecting and outputting the sine wave data and the cosine wave data, the polarities of both being processed according to the states of two bits of one and two higher order bits next to the largest significant bit.

2. The waveform data generation apparatus according to claim 1, wherein:

said first storage means is a nonvolatile memory;

said second storage means is a nonvolatile memory;

said pulse counting means is a counter circuit;

said angle inversion means is an inverter circuit;

said first selection means is a two-input selector circuit;

said second selection means is composed of two two-input selector circuits provided in parallel to each other;

said first polarity conversion means is an inverter circuit;

said second polarity conversion means is an inverter circuit; and said third selection means is composed of two two-input selector circuits provided in parallel to each other.

3. The waveform data generation apparatus according to claim 1, wherein:

said first storage means stores sine wave data within a range 0–45 degrees; and said second storage means stores sine wave data within a range 45–90 degrees.

4. The waveform data generation apparatus according to claim 1, wherein:

said first storage means stores sine wave data within a range 0–45 degrees; and said second storage means stores cosine wave data within a range 0–45 degrees.

* * * * *